United States Patent
Ma

(10) Patent No.: US 7,322,829 B2
(45) Date of Patent: Jan. 29, 2008

(54) LAND GRID ARRAY CONNECTOR

(75) Inventor: Hao-Yun Ma, Tu-Cheng (TW)

(73) Assignee: Hon Hai Precision Ind. Co., Ltd., Taipei Hsien (TW)

(*) Notice: Subject to any disclaimer, the term of this patent is extended or adjusted under 35 U.S.C. 154(b) by 0 days.

(21) Appl. No.: 11/474,566

(22) Filed: Jun. 26, 2006

(65) Prior Publication Data

US 2006/0292935 A1  Dec. 28, 2006

(30) Foreign Application Priority Data

Jun. 24, 2005  (TW) .............................. 94121255 A

(51) Int. Cl.
*H01R 12/00* (2006.01)
(52) U.S. Cl. ........................... 439/66; 439/71; 439/752
(58) Field of Classification Search .................. 439/66, 439/70–71, 752
See application file for complete search history.

(56) References Cited

U.S. PATENT DOCUMENTS 4,094,062 A * 6/1978 Papanikolaou ............. 30/34.05
6,695,624 B1 * 2/2004 Szu ............................. 439/66

* cited by examiner

*Primary Examiner*—Truc Nguyen
(74) *Attorney, Agent, or Firm*—Wei Te Chung

(57) ABSTRACT

An LGA electrical connector (10) includes an insulative body (20) of a substantially rectangular shape with a number of receiving holes (26), and a number of terminals (30) received in the respective receiving holes of the insulative body. Each of the terminals has a mounting portion (36) adapted for being soldered to a printed circuit board. The receiving hole includes a through hole (260) and a guiding hole (264) in lateral communication with the through hole. The guiding hole is provided on a surface of the insulative body, from which the associated terminal is inserted. This configuration of the terminal receiving holes, including the guiding hole, has the advantage of facilitating beam inspection of the terminal through a beam emitter (40).

3 Claims, 5 Drawing Sheets

LAND GRID ARRAY CONNECTOR

BACKGROUND OF THE INVENTION

1. Field of the Invention

The present invention relates to the art of electrical connectors, and more particularly to a land grid array (LGA) connector with terminal receiving holes for facilitating inspection of terminals.

2. General Background

Various types of connectors have been developed for electrical connections to an IC package and a printed circuit board, such as Pin Grid Array (PGA) connectors, Ball Grid Array (BGA) connectors, Land Grid Array (LGA) connectors, etc., the names of which are assigned thereto based on conductive elements of the IC package that connectors electrically connect. Contacts resided within the respective connectors are accordingly classified as PGA contacts, BGA contacts, LGA contacts and so on.

As shown in FIG. 5, a conventional LGA connector generally includes a housing 6 with a plurality of passageways 60 extending therethrough, and terminals 50 adapted to be retained in the respective passageways 60 of the housing 6. Each of the terminals 50 has a mounting portion 56 extending toward a mounting surface of the housing 6, which is adapted to face a printed circuit board (not shown).

A problem, however, with the connector terminal 50 is that mechanical characteristics of the connector terminal 50, such as co-planarity of each of the terminal 50 with respect to the mounting surface of the housing 6, uniformity of metal material used to plate with the terminal mounting portion 56, etc., are not easily inspected by inspection beams emitted by a light 40. This is so because a distance, designated as "C", between an outer edge of the mounting portion 56 and a corresponding sidewall of the housing 6 is limited, and thus the light beam, to be entering, is obstructed. This will affect the inspection accuracy of the connector terminal 50. In addition, for some instances, the connector terminals 50 are prone to be damaged during insertion of the terminals 50 into the respective passageways 60 of the housing 6, due to portions of the terminals 50 along an insertion direction being easily crashed against walls of the housing 6 adjacent the corresponding passageways 60.

SUMMARY OF THE INVENTION

An LGA electrical connector according to an embodiment of the present invention is provided to include an insulative body of a substantially rectangular shape with a plurality of terminal receiving holes, and a plurality of terminals received in the respective receiving holes of the insulative body. Each of the terminals has a mounting portion adapted for being soldered to a printed circuit board. The receiving hole includes a through hole and a guiding hole in lateral communication with the through hole. The guiding hole is provided on a surface of the insulative body, from which the associated terminal is inserted. As compared with the prior art, this configuration of the terminal receiving holes, each including the guiding hole and the through hole, has the advantages of facilitating beam inspection of the terminal through a beam lighter, as well as of facilitating the insertion of the terminal into the insulative housing while having no damage of the terminal by initially inserting the terminal along a path provided by the guiding hole of the insulative housing.

Other features and advantages of the present invention will become more apparent to those skilled in the art upon examination of the following drawings and detailed description of preferred embodiments, in which:

DETAILED DESCRIPTION OF PREFERRED EMBODIMENT

Figure 1:
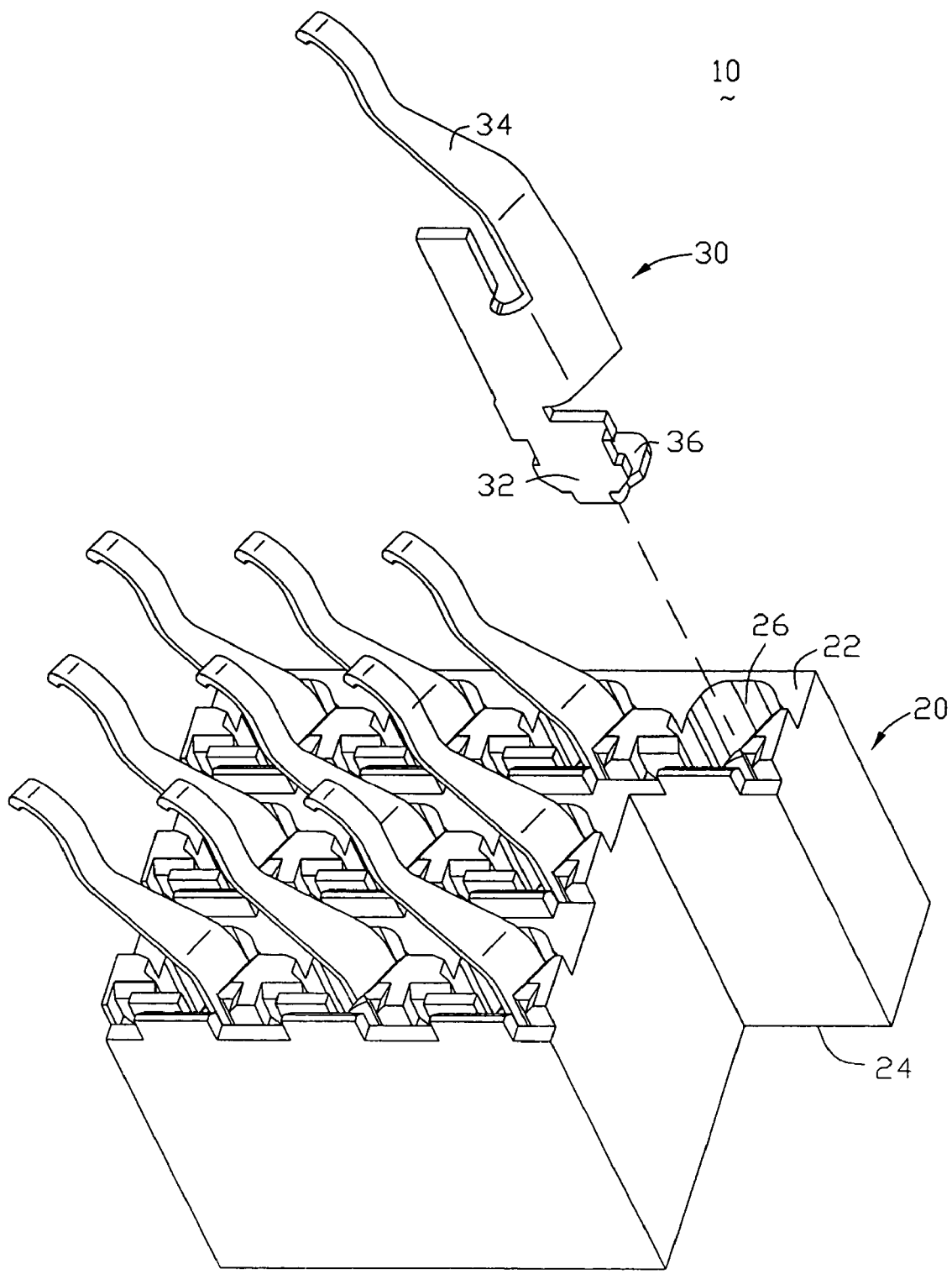
FIG. 1 is a simplified, perspective view of part of an LGA electrical connector according to an embodiment of the present invention, with one terminal disposed out of a corresponding terminal receiving hole.
Figure 2:
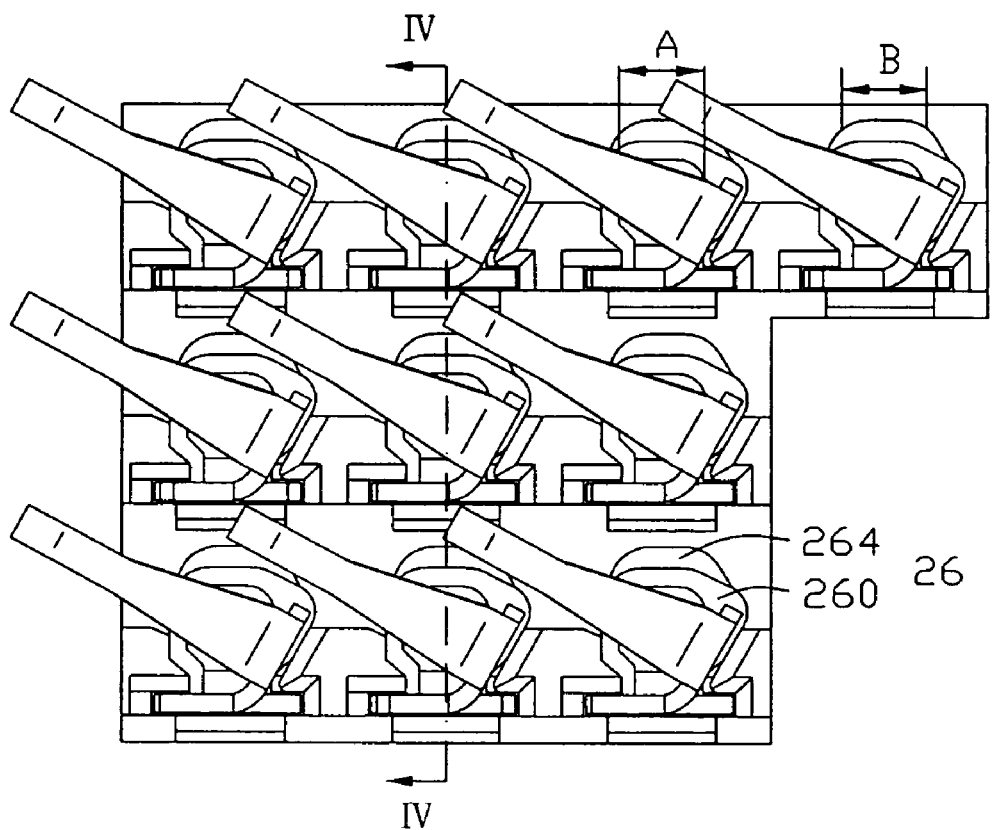
FIG. 2 is a top view of the LGA connector of FIG. 1.
Figure 3:
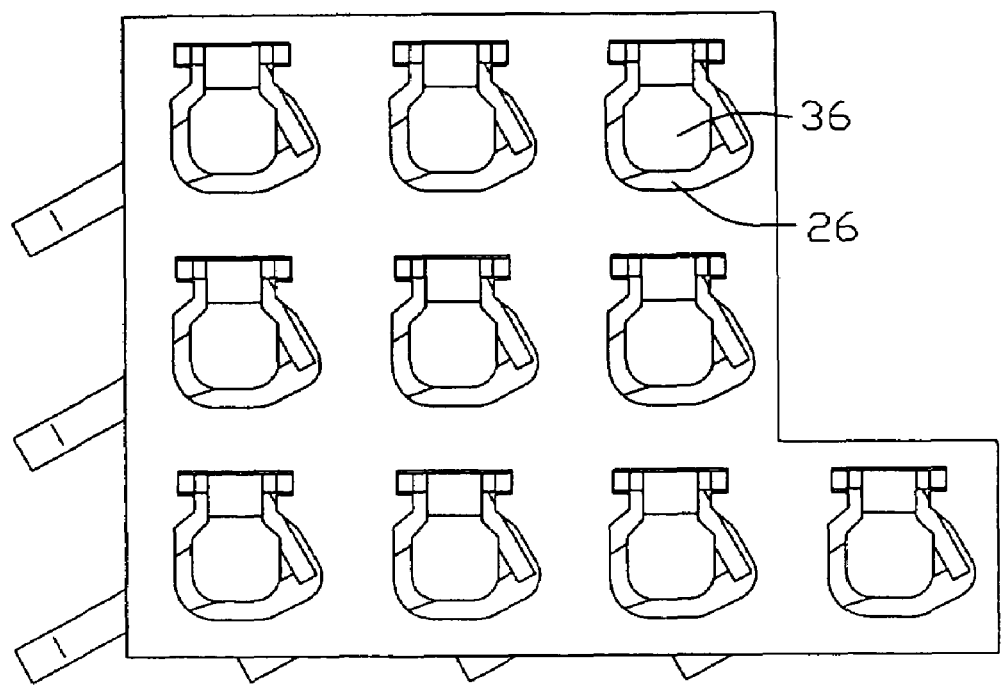
FIG. 3 is a bottom view of the LGA connector of FIG. 1.
Figure 4:
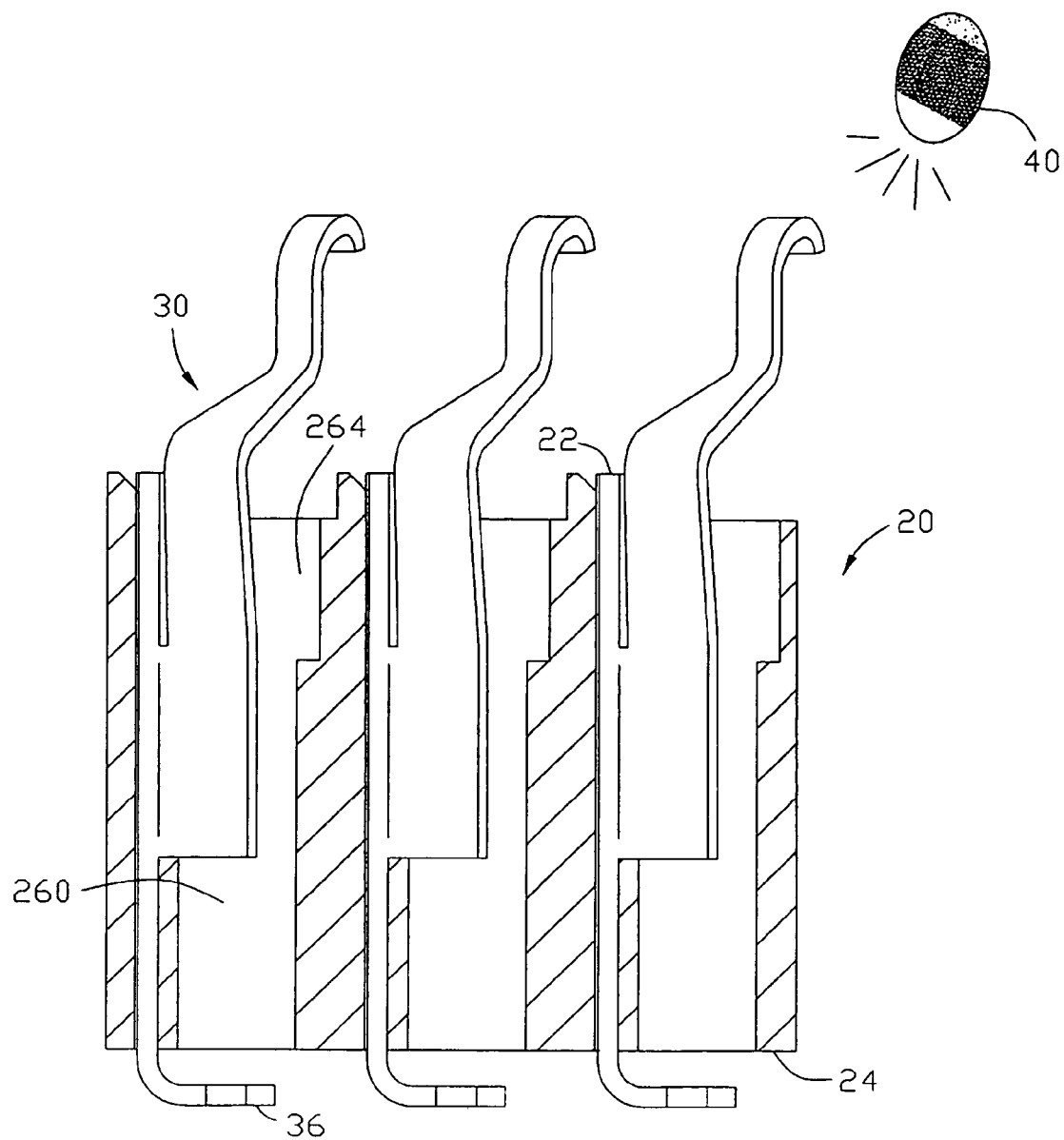
FIG. 4 is a cross sectional view of the LGA connector of FIG. 2 taken along line IV-IV.
Figure 5:
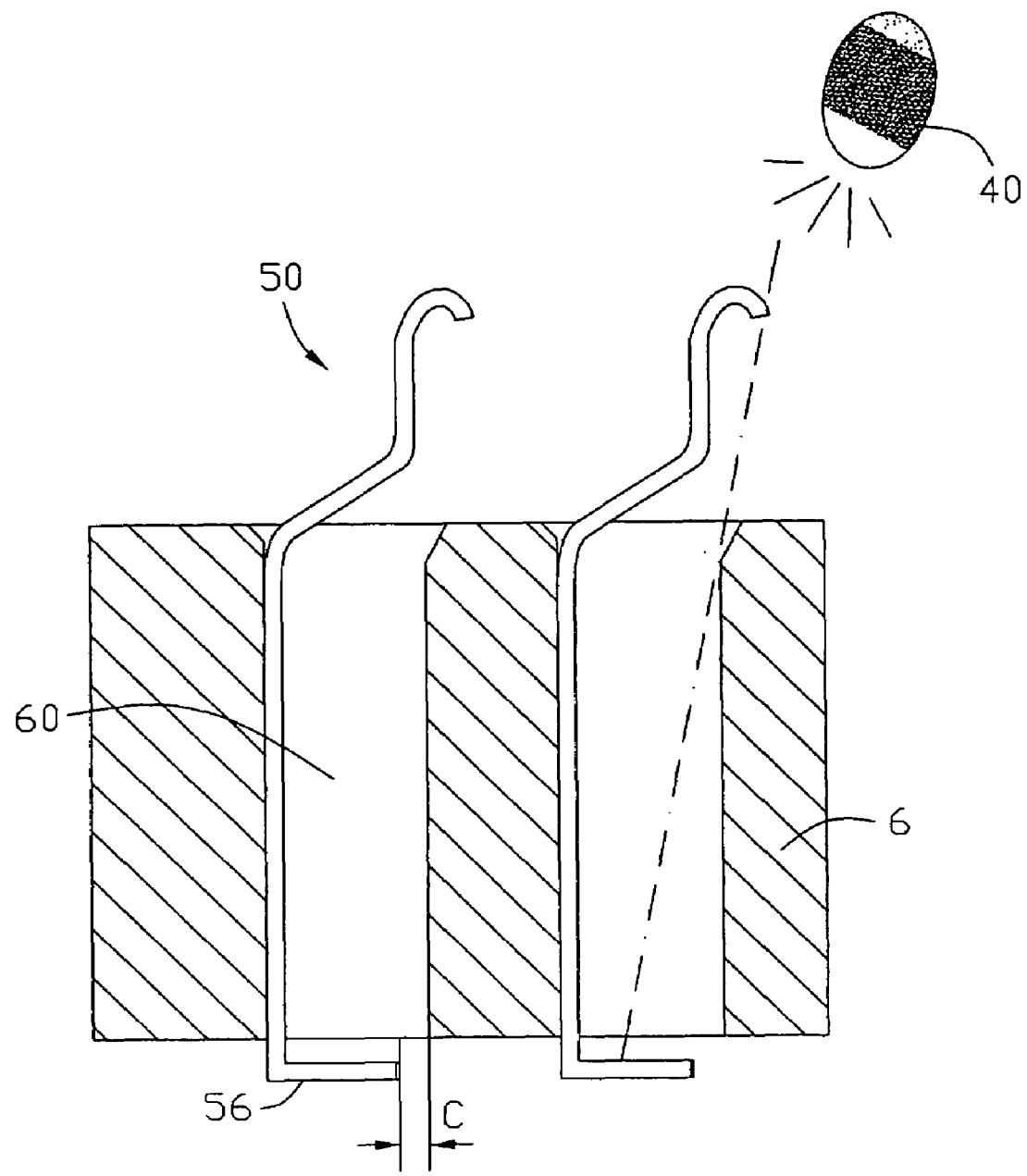
FIG. 5 is a cross sectional view of a conventional LGA connector, showing a terminal retained in a corresponding terminal receiving hole.

Referring to FIGS. 1 to 4, an LGA electrical connector 10 according to the embodiment of the present invention is shown to include an insulative body or housing 20, and a plurality of terminals 30 retained in the insulative housing 20.

Each of the terminals 30 includes a retention portion 32 for at least partially being retained in receiving holes of the housing, a mating portion 34 extending upwardly from the retention portion 32 for mating with a mating electronic component, such as an IC package (not shown), and a mounting portion 36 extending toward a mounting surface 24 of the insulative housing 20 and adapted for being soldered onto a board member, such as a printed circuit board (not shown). The mounting portion 36 is configured as a planar shape for a mass of fusible material (not shown) to be attached thereon. In this embodiment, the mounting portion 36 extends beyond the mounting surface 24 of the insulative housing 20.

The insulative housing 20 is of a substantially rectangular shape, and defines a mating surface 22, adapted to mate with the IC package, and the mounting surface 24, adapted to face the printed circuit board. A plurality of terminal receiving holes 26 extends vertically from the mating surface 22 toward the mounting surface 24. Each of the terminal receiving holes 26 further includes a through hole 260 and a guiding hole 264 in lateral communication with the through hole 260. The guiding hole 264 is provided on a surface of the insulative housing 20, from which the associated terminal 30 is inserted, and extends through a part of the insulative body 20. In this embodiment, the guiding hole 264 is formed on a mating surface 22, away from a position where the terminal mounting portion 36 is positioned. Therefore, from a view shown in FIG. 4, a first upper part of the terminal receiving hole 26, i.e., including the guiding hole 264 and part of the through hole 260 laterally in communication with the guide hole 264, in horizontal dimension, designated as "B", is larger than the lower remaining second lower part of the receiving hole 26 except for the guiding hole 264, designated as "A", in a horizontal direction. As compared with the prior art, this configuration of the terminal receiving holes 26, each including the guiding hole 264 and the through hole 260, has the advantages of facilitating beam inspection of the terminal through a lighting device 40, as well as of facilitating the insertion of the terminal 30 into the insulative housing 20 while having no damage of the terminal 30 by initially inserting the terminal 30 along the guiding hole 264 of the insulative housing 20.

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. A land grid array (LGA) electrical connector comprising:
   an insulative body of a substantially rectangular shape, the insulative body including a plurality of terminal receiving holes;
   a plurality of terminals received in the respective terminal receiving holes, each terminal having a contact portion and a mounting portion;
   wherein the mounting portion adapted to be soldered to a printed circuit board and a retention portion for at least partially being retained in one side of the receiving holes; and
   each of the receiving hole in communication with the through hole, said guiding hole extending from a surface of the insulative body along another side of the receiving hole, from which the associated terminal is inserted, wherein no portion of the contact extends into the guiding hole;
   wherein the guiding holes is in lateral communication with the through hole; and
   wherein the guiding hole extends through a part of the insulative body.

2. The LGA electrical connector as recited in claim 1, wherein the contact portion has a generally planar configuration.

3. An electrical connector comprising:
   an insulative housing defining a plurality of passageways arranged in matrix, each of said passageways defining a main through hole and a guiding hole located beside said through hole and adjacent to an upper face of the housing, said guiding hole extending downwardly in a distance generally not less than one fifth of a whole height of said main through hole;
   a plurality of terminals disposed in the corresponding passageways respectively,
   each of said terminals defining a mating portion upwardly extending above the upper face of the housing and adapted to be pressed by a complementary part for electrical connection; wherein
   from a top view, said mating portion extends in a direction so as not to be essentially overlapped with the corresponding guiding hole of the passageway in which said terminal is received, whereby an inspection light beam is allowed to easily enter the main through hole via said guiding hole and reach a bottom of said main through hole to inspect a tail of the terminal, under a condition that the guiding hole is fully empty without being occupied by any part of the corresponding terminal, and due to said guiding hole there is no part of the housing in the corresponding passageway to block said insertion light beam before said inspection light beam hits the tail of the terminal.

* * * * *